(12) United States Patent
Fujita

(10) Patent No.: US 11,348,853 B2
(45) Date of Patent: May 31, 2022

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Yuuichi Fujita, Ibo Hyogo (JP)

(73) Assignees: KABUSHIKI KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 0 days.

(21) Appl. No.: 16/992,863

(22) Filed: Aug. 13, 2020

(65) Prior Publication Data

US 2021/0296197 A1 Sep. 23, 2021

(30) Foreign Application Priority Data

Mar. 23, 2020 (JP) .............................. JP2020-051027

(51) Int. Cl.
*H01L 29/40* (2006.01)
*H01L 21/00* (2006.01)
*H01L 23/31* (2006.01)

(52) U.S. Cl.
CPC .... *H01L 23/3142* (2013.01); *H01L 2924/186* (2013.01); *H01L 2924/18301* (2013.01)

(58) Field of Classification Search
CPC ................ H01L 23/3142; H01L 2924/18301
USPC .................. 438/118–121; 257/676, 711, 783
See application file for complete search history.

(56) References Cited

U.S. PATENT DOCUMENTS

| 6,498,055 | B2* | 12/2002 | Fukuda | ............... H01L 23/3128 |
| | | | | 438/127 |
| 7,157,707 | B2* | 1/2007 | Ludwig | ..................... G01J 5/10 |
| | | | | 136/224 |
| 7,554,192 | B2* | 6/2009 | Koga | ..................... H01L 23/053 |
| | | | | 257/678 |
| 10,468,315 | B2* | 11/2019 | Harada | ................... H01L 23/28 |
| 10,483,176 | B2* | 11/2019 | Oya | ...................... H01L 23/053 |
| 2003/0098912 | A1* | 5/2003 | Hosokai | .............. H01L 31/0203 |
| | | | | 348/207.99 |
| 2019/0214322 | A1 | 7/2019 | Taya | |

FOREIGN PATENT DOCUMENTS

| JP | 6399272 B1 | 10/2018 |
| JP | 6407451 B2 | 10/2018 |
| JP | 6526229 B2 | 6/2019 |
| JP | 2019197816 A | 11/2019 |
| WO | 2018042973 A1 | 3/2018 |

* cited by examiner

*Primary Examiner* — Calvin Lee
(74) *Attorney, Agent, or Firm* — Kim & Stewart LLP

(57) ABSTRACT

A semiconductor device according to an embodiment includes a metal plate, a semiconductor chip, an insulating substrate provided between the metal plate and the semiconductor chip, a frame body surrounding the insulating substrate, a mesh-shaped sheet provided between the metal plate and the frame body, an adhesive agent provided between the metal plate and the frame body, and a sealing material being surrounded by the frame body and covering the semiconductor chip and the insulating substrate.

25 Claims, 16 Drawing Sheets

AA'CROSS SECTION

BB'CROSS SECTION

SEMICONDUCTOR DEVICE

CROSS-REFERENCE TO RELATED APPLICATION

This application is based upon and claims the benefit of priority from Japanese Patent Application No. 2020-051027, filed on Mar. 23, 2020, the entire contents of which are incorporated herein by reference.

FIELD

Embodiments described herein relate generally to semiconductor devices.

BACKGROUND

In a power semiconductor module, a power semiconductor chip is mounted on, for example, a metal plate with an insulating substrate interposed between the power semiconductor chip and the metal plate. The power semiconductor chip is, for example, an insulated gate bipolar transistor (IGBT), a metal oxide field effect transistor (MOSFET), or a diode.

In order to protect the power semiconductor chip, a resin case surrounding the insulating substrate is provided on the metal plate. Then, the resin case is filled with a sealing material that covers the power semiconductor chip and the insulating substrate.

The metal plate and the resin case are adhered to each other by using an adhesive. When the adhesion between the metal plate and the resin case is insufficient, there occurs, for example, a problem that the sealing material leaks out.

DETAILED DESCRIPTION

Figure 1A:
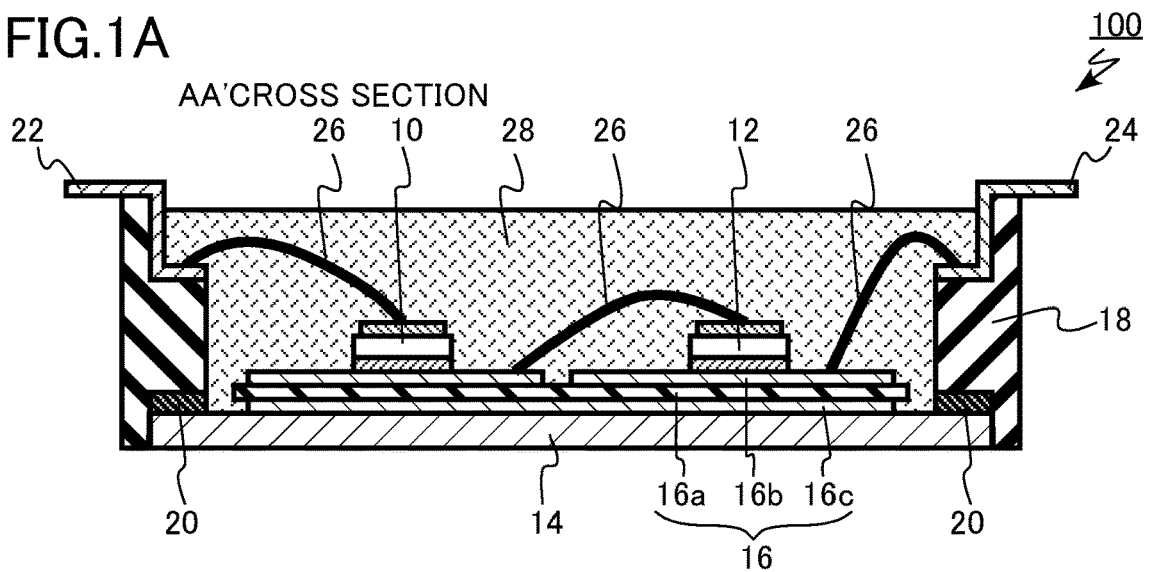
FIGS. 1A, 1B, and 1C are schematic views of a semiconductor device according to an embodiment.

A semiconductor device according to an embodiment includes a metal plate, a semiconductor chip, an insulating substrate provided between the metal plate and the semiconductor chip, a frame body surrounding the insulating substrate, a mesh-shaped sheet provided between the metal plate and the frame body, an adhesive agent provided between the metal plate and the frame body, and a sealing material being surrounded by the frame body and covering the semiconductor chip and the insulating substrate.

In this specification, in some cases, the same or similar members are denoted by the same reference numerals, and duplicate description may be omitted.

In this specification, in some cases, in order to illustrate the positional relationship of parts and the like, the upward direction of the drawings may be referred to as "upper", and the downward direction of the drawings may be referred to as "lower". In this specification, the terms "upper" and "lower" do not necessarily indicate the relationship with the direction of gravity.

The semiconductor device according to the embodiment includes a metal plate, a semiconductor chip, an insulating substrate provided between the metal plate and the semiconductor chip, a frame body surrounding the insulating substrate, a mesh-shaped sheet provided between the metal plate and the frame body, an adhesive agent provided between the metal plate and the frame body, and a sealing material being surrounded by the frame body and covering the semiconductor chip and the insulating substrate.

Figure 1B:
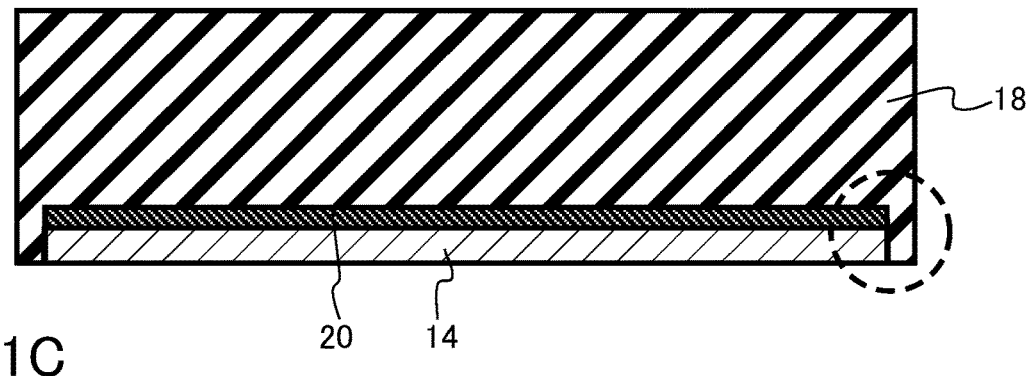
Figure 1C:
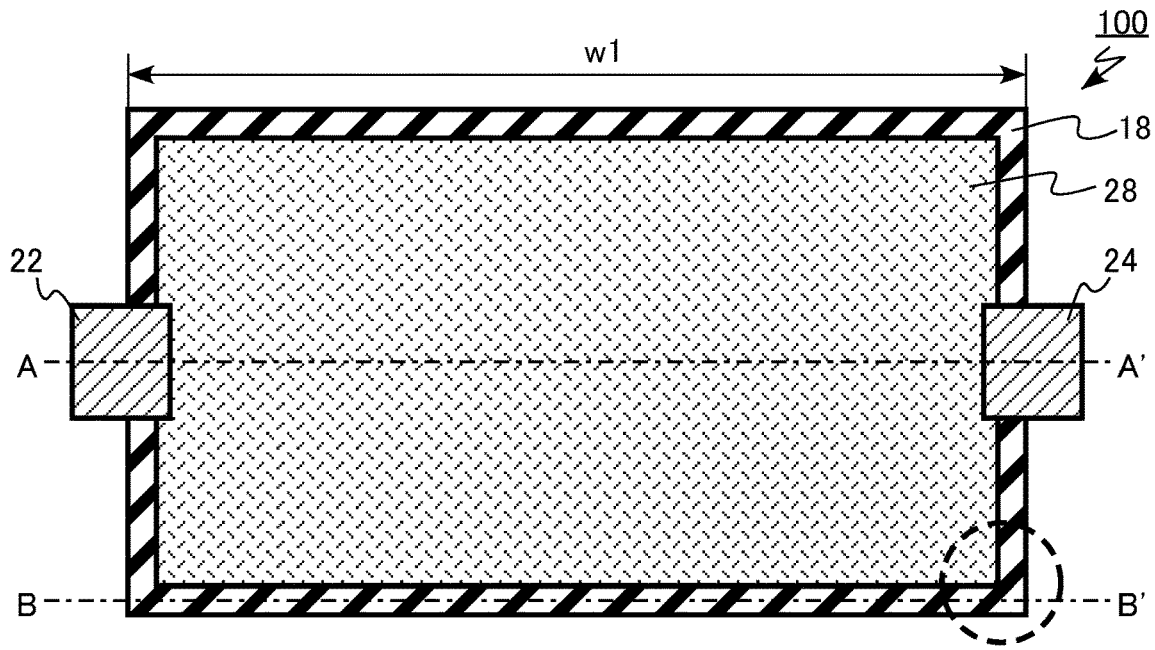

FIGS. 1A, 1B, and 1C are schematic views of the semiconductor device according to the embodiment. FIGS. 1A and 1B are cross-sectional views. FIG. 1C is a top view. FIG. 1A illustrates a cross section taken along the line AA' of FIG. 1C. FIG. 1B illustrates a cross section taken along the line BB' of FIG. 1C.

The semiconductor device according to the embodiment is a power semiconductor module 100. As illustrated in FIG. 1, in the power semiconductor module 100 according to the embodiment, two IGBTs are connected in series. The power semiconductor module 100 according to the embodiment is a so-called "2 in 1" type module in which a half bridge circuit can be configured with one module. For example, a three-phase inverter circuit can be configured by using three power semiconductor modules 100 according to the embodiment.

The power semiconductor module 100 according to the embodiment includes a first IGBT 10 (semiconductor chip), a second IGBT 12, a metal base 14 (metal plate), an insulating substrate 16, a resin case 18 (frame body), an adhesive layer 20, a first power terminal 22, a second power terminal 24, a bonding wire 26, and a sealing resin (sealing material). The insulating substrate 16 has a ceramic layer 16a, a front-surface metal layer 16b, and a back-surface metal layer 16c. The adhesive layer 20 has a resin sheet 20a (sheet) and an adhesive agent 20b.

In addition, the power semiconductor module 100 includes an AC terminal and a gate terminal, which are not illustrated. In addition, the power semiconductor module 100 may include a resin lid (not illustrated) on the sealing resin 28.

Figure 2A:
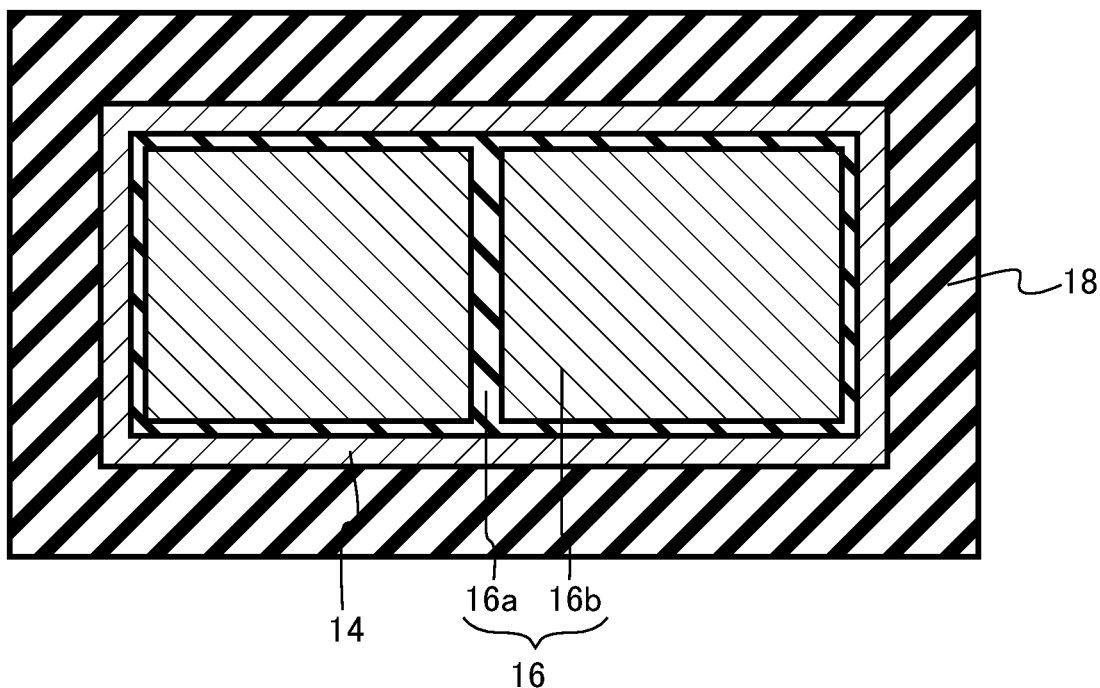
FIGS. 2A and 2B are schematic top views of the semiconductor device according to the embodiment.
Figure 2B:
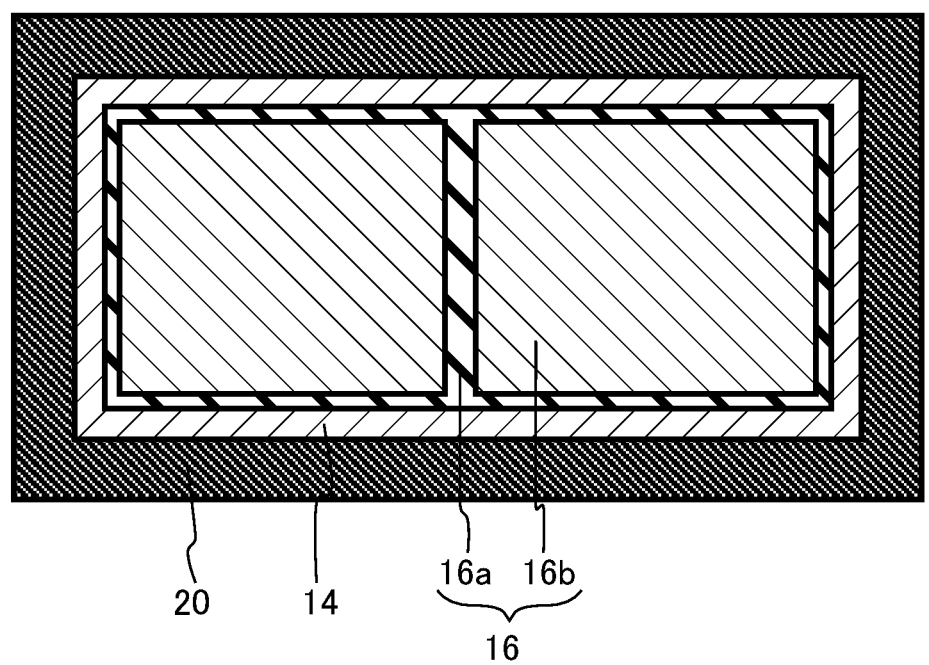

FIGS. 2A and 2B are schematic top views of the semiconductor device according to the embodiment. FIG. 2A is a top view in which the first IGBT 10, the second IGBT 12, the first power terminal 22, the second power terminal 24, the bonding wire 26, and the sealing resin 28 are removed. FIG. 2B is a top view in which the resin case 18 is further removed from FIG. 2A.

Figure 3A:
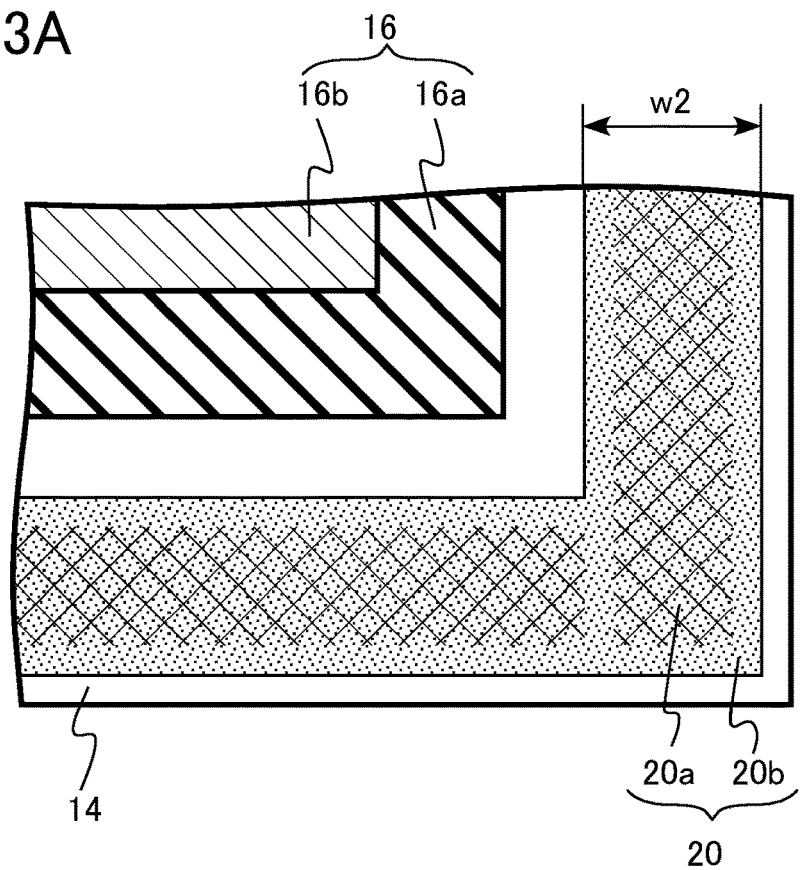
FIGS. 3A and 3B are enlarged schematic views of the semiconductor device according to the embodiment.
Figure 3B:
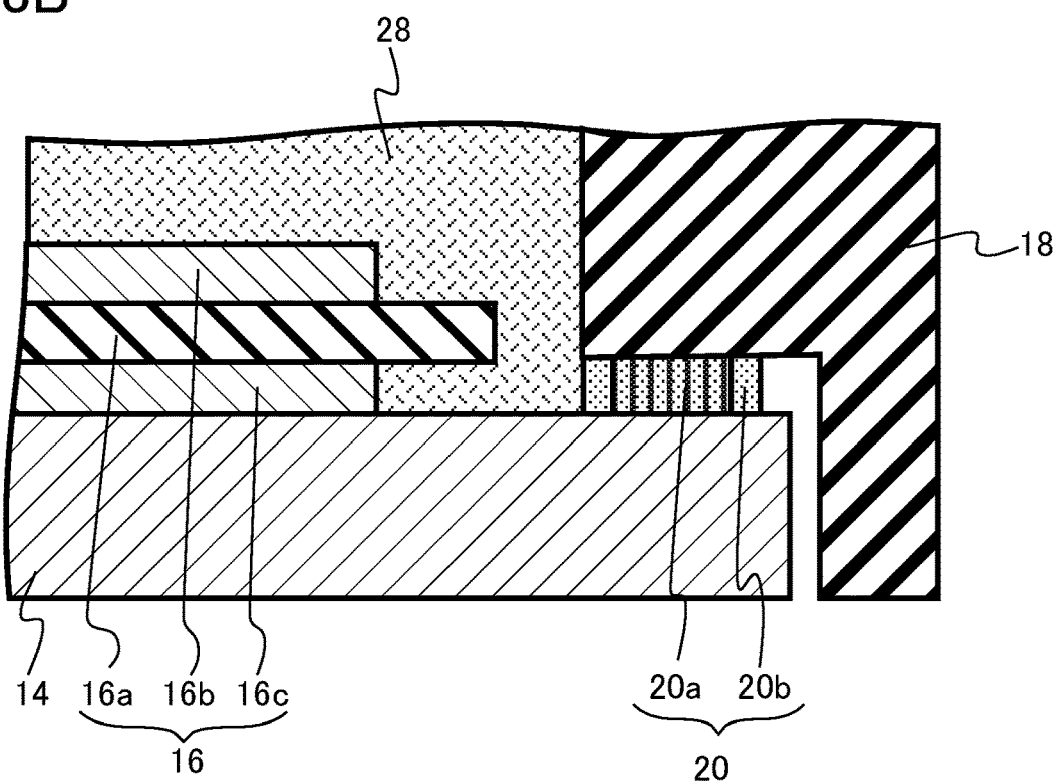

FIGS. 3A and 3B are enlarged schematic views of the semiconductor device according to the embodiment. FIG. 3A and FIG. 3B are enlarged schematic views of a region surrounded by a dotted circle in FIGS. 1B and 1C.

FIG. 3A is an enlarged schematic view of a region surrounded by a dotted circle in FIG. 1C, and is a top view in which the sealing resin 28 and the resin case 18 are removed. FIG. 3B is an enlarged cross-sectional view of a region surrounded by a dotted circle in FIG. 1B.

The first IGBT 10 and the second IGBT 12 are provided on the insulating substrate 16. The first IGBT 10 is an example of a semiconductor chip.

The metal base 14 is an example of a metal plate. The metal base 14 is made of, for example, copper. For example, when mounting the power semiconductor module 100 on a product, a heat dissipation plate (not illustrated) is connected to a back surface of the metal base 14.

The insulating substrate 16 is provided on the metal base 14. The insulating substrate 16 is provided between the metal base 14 and the first IGBT 10 and between the metal base 14 and the second IGBT 12. The insulating substrate 16 has a function of electrically separating the metal base 14 from the first IGBT 10 and the second IGBT 12.

The insulating substrate 16 has a ceramic layer 16a, a front-surface metal layer 16b, and a back-surface metal layer 16c. The ceramic layer 16a is provided between the front-surface metal layer 16b and the back-surface metal layer 16c.

The ceramic layer 16a is made of, for example, aluminum oxide, aluminum nitride, or silicon nitride. The front-surface metal layer 16b and the back-surface metal layer 16c are made of, for example, copper.

The resin case 18 is provided around the metal base 14 and the insulating substrate 16. The resin case 18 surrounds the metal base 14 and the insulating substrate 16. The resin case 18 is an example of a frame body. The resin case 18 has a function of protecting the first IGBT 10, the second IGBT 12, and the insulating substrate 16.

The maximum width (w1 in FIG. 1C) of the resin case 18 is, for example, 80 mm or more and 150 mm or less. By setting the maximum width w to 150 mm or less, the downsizing of the power semiconductor module 100 is realized.

The adhesive layer 20 is provided between the metal base 14 and the resin case 18. The adhesive layer 20 has a function of adhering and fixing the metal base 14 and the resin case 18.

The adhesive layer 20 is provided on the metal base 14 so as to surround the insulating substrate 16. The width (w2 in FIG. 3A) of the adhesive layer 20 is, for example, 2 mm or more and 6 mm or less.

The adhesive layer 20 includes a resin sheet 20a and an adhesive agent 20b. The resin sheet 20a is an example of a sheet.

The resin sheet 20a is provided between the metal base 14 and the resin case 18. The resin sheet 20a is a mesh-shaped sheet. The resin sheet 20a has a function of retaining the adhesive agent 20b before the metal base 14 and the resin case 18 are adhered to each other.

The shape of the mesh of the resin sheet 20a is not particularly limited. For example, the shape is not limited to the grid shape illustrated in FIG. 3A, and the shape may be, for example, a ladder shape. In addition, the line forming the mesh of the resin sheet 20a may include a curved line.

For example, as illustrated in FIG. 3A, the resin sheet 20a may be divided into a region extending in the horizontal direction of the figure and a region extending in the vertical direction of the figure.

The width of the resin sheet 20a is, for example, 2 mm or more and 5 mm or less. The thickness of the resin sheet 20a is, for example, 200 µm or more and 500 µm or less.

The mesh opening of the mesh of the resin sheet 20a is, for example, 50 µm or more and 1000 µm or less. The mesh opening of the mesh is the distance between the lines forming the mesh.

The resin sheet 20a contains a resin. The resin sheet 20a contains, for example, silicone. The resin sheet 20a is made of, for example, a silicone resin. As the resin sheet 20a, for example, other resins such as an epoxy resin can be employed.

The adhesive agent 20b is provided between the metal base 14 and the resin case 18. The adhesive agent 20b has a function of adhering the metal base 14 and the resin case 18. At least a portion of the adhesive agent 20b is located in the mesh of the resin sheet 20a.

The width (w2) of the adhesive agent 20b is, for example, 2 mm or more and 6 mm or less. The thickness of the adhesive agent 20b is, for example, 200 µm or more and 600 µm or less.

The adhesive agent 20b contains a resin. The adhesive agent 20b contains, for example, silicone. The adhesive agent 20b is, for example, a silicone resin. As the adhesive agent 20b, for example, other resins such as an epoxy resin can be employed.

The adhesive agent 20b is a thermosetting resin. The viscosity of the adhesive agent 20b before curing is, for example, 30 Pa·s or more and 100 Pa·s or less. The viscosity of the adhesive agent 20b before curing is, for example, 30 Pa·s or more and less than 100 Pa·s.

In addition, whether or not the mesh-shaped resin sheet 20a exists in the adhesive layer 20 can be determined by, for example, observing with a scanning electron microscope (SEM). In addition, whether or not at least a portion of the adhesive agent 20b is located in the mesh of the resin sheet 20a can be determined by, for example, observing with the SEM.

The resin sheet 20a and the adhesive agent 20b are located between the resin case 18 and the metal base 14 in the direction from the metal base 14 toward the insulating substrate 16.

In the power semiconductor module 100 according to the embodiment, for example, the metal base 14 and the resin case 18 are fixed only by the adhesive layer 20. The power semiconductor module 100 is not provided with, for example, a fixing screw that fixes the metal base 14 and the resin case 18. By not providing the fixing screw, the size of the power semiconductor module 100 can be easily reduced.

The first power terminal 22 and the second power terminal 24 are provided above the resin case 18. For example, a negative voltage is applied to the first power terminal 22. For example, a positive voltage is applied to the second power terminal 24.

The bonding wire 26 electrically connects, for example, the first power terminal 22 and the first IGBT 10, the surface metal layer 16b and the second IGBT 12, and the surface metal layer 16b and the second power terminal 24. The bonding wire 26 is, for example, an aluminum wire.

The resin case 18 is filled with the sealing resin 28. The sealing resin 28 is surrounded by the resin case 18. The sealing resin 28 covers the first IGBT 10, the second IGBT 12, and the insulating substrate 16. The sealing resin 28 is an example of a sealing material.

The sealing resin 28 has a function of protecting the first IGBT 10, the second IGBT 12, and the insulating substrate 16. In addition, the sealing resin 28 has a function of insulating the first IGBT 10, the second IGBT 12, and the insulating substrate 16.

The sealing resin 28 contains a resin. The sealing resin 28 is made of, for example, silicone gel. As the sealing resin 28, for example, other resins such as an epoxy resin and a polyimide resin can be employed.

Next, an example of a method of manufacturing the power semiconductor module 100 according to the embodiment will be illustrated. FIGS. 4, 5A, 5B, 6A, 6B, 7A, 7B, 8A, 8B, 9A, 9B, 10A, and 10B illustrate a method of manufacturing the semiconductor device according to the embodiment. FIGS. 5A, 6A, 7A, 8A, 9A, and 10A are views of portions corresponding to FIG. 3A. FIGS. 5B, 6B, 7B, 8B, 9B, and 10B are views of portions corresponding to FIG. 3B.

Figure 4:
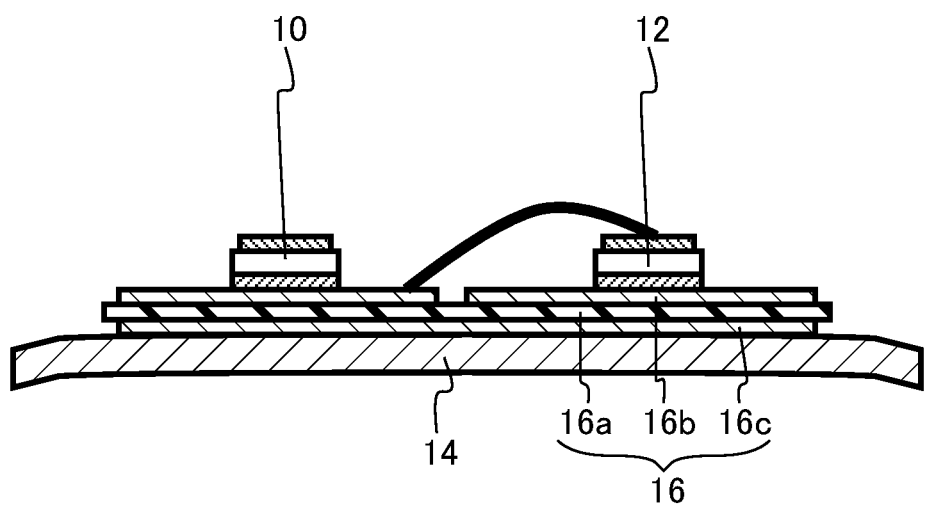
FIG. 4 is a view illustrating a method of manufacturing the semiconductor device according to the embodiment.
Figure 5A:
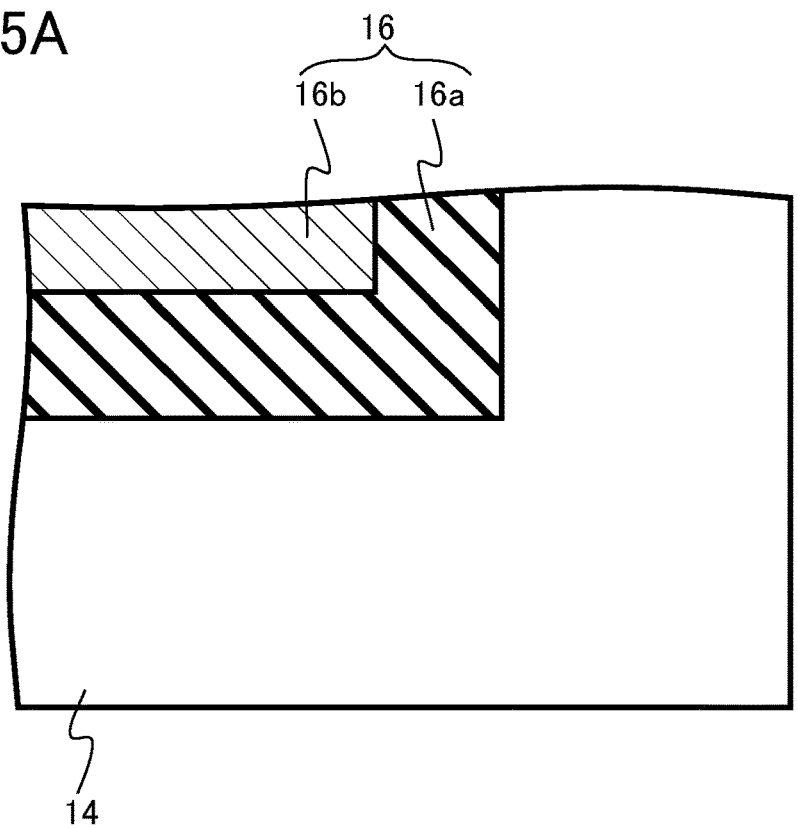
FIGS. 5A and 5B are views illustrating the method of manufacturing the semiconductor device according to the embodiment.
Figure 5B:
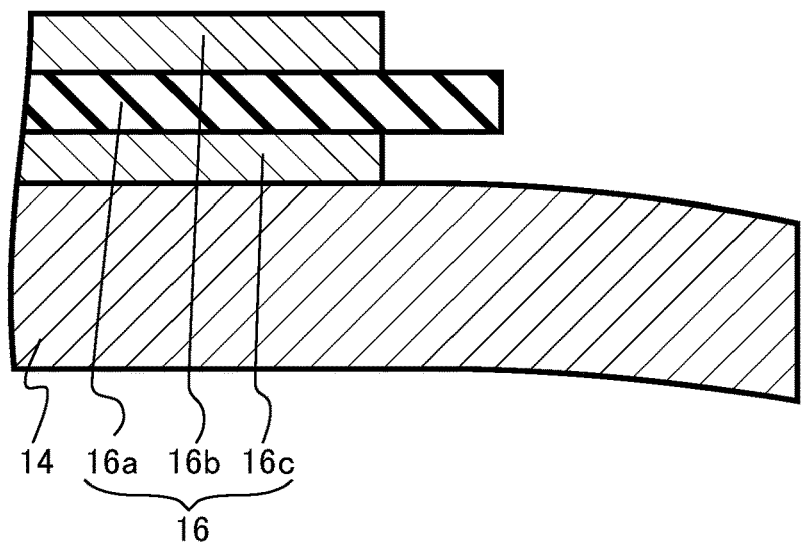

First, the insulating substrate 16 on which the first IGBT 10 and the second IGBT 12 are mounted is fixed on the metal base 14 (FIGS. 4, 5A, 5B). The metal base 14 and the insulating substrate 16 are fixed by, for example, a solder layer (not illustrated).

As illustrated in FIG. 4, before the resin case 18 is adhered to the metal base 14, for example, a shape convex upward is formed in the lower surface of the metal base 14. In other words, the end is curved downward with respect to the central portion of the metal base 14. The above-described shape is to allow the shape of the lower surface of the metal base 14 to be convex downward so as to improve the adhesion between the lower surface of the metal base 14 and the heat dissipation plate when being assembled as a final product. Deformation due to heat shrinkage or the like of the members during assembly is taken into consideration.

Figure 6A:
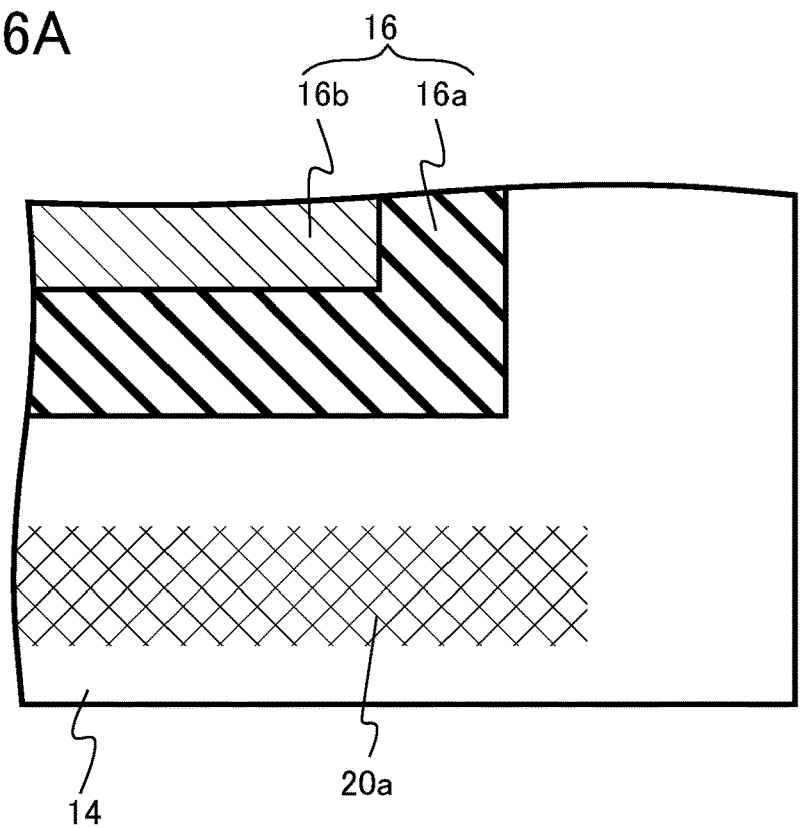
FIGS. 6A and 6B are views illustrating the method of manufacturing the semiconductor device according to the embodiment.
Figure 6B:
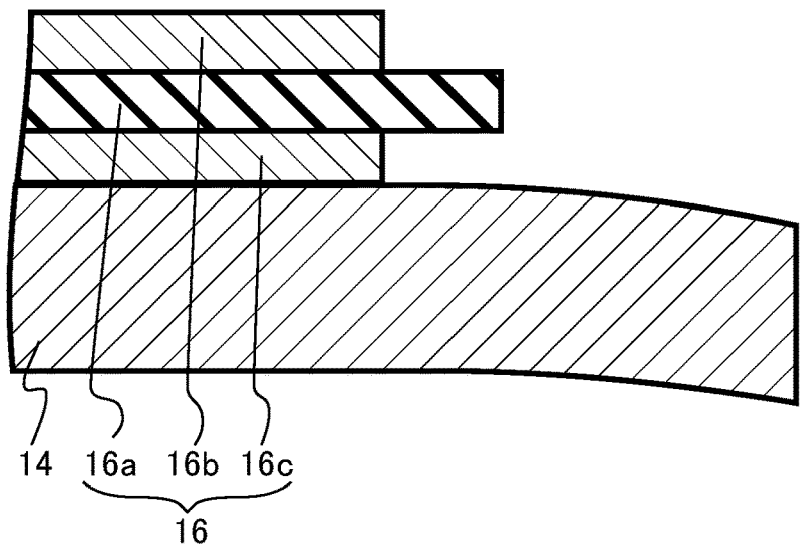

Next, a portion of the resin sheet 20a is disposed on the metal base 14 (FIGS. 6A and 6B). The resin sheet 20a is disposed on the region of the resin case 18 where the adhesion is planned.

Figure 7A:
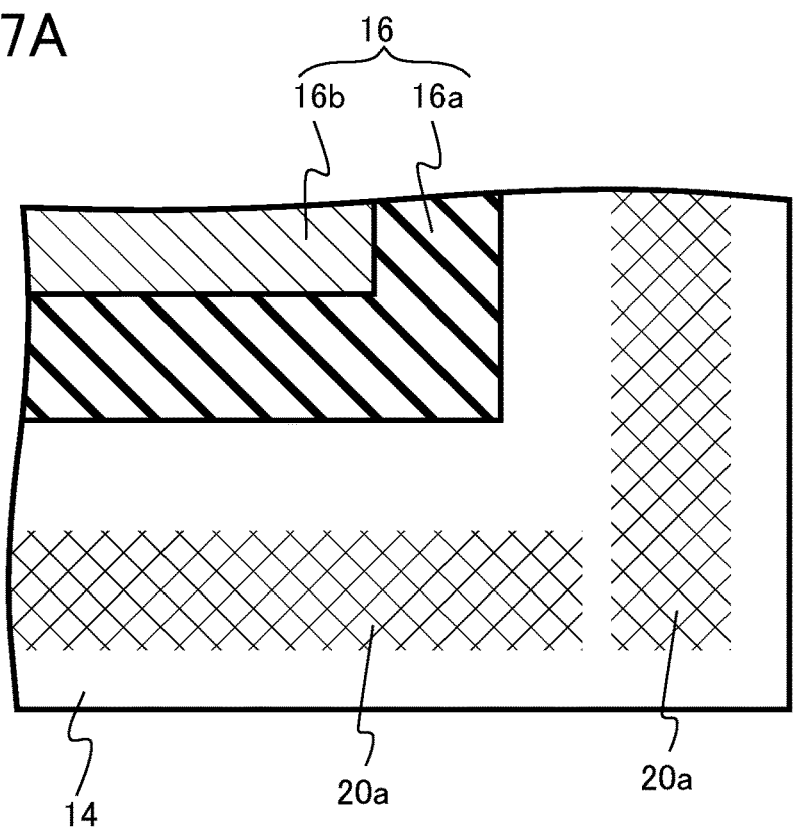
FIGS. 7A and 7B are views illustrating the method of manufacturing the semiconductor device according to the embodiment.
Figure 7B:
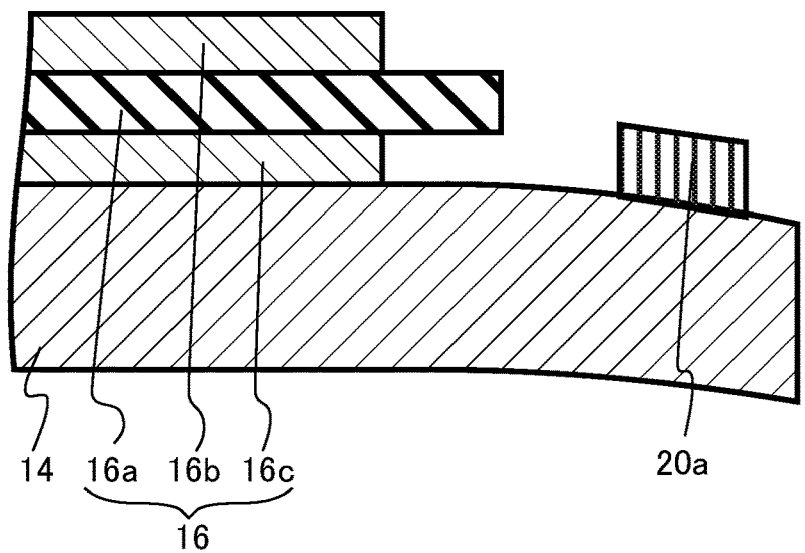

Next, the remaining portion of the resin sheet 20a is disposed on the metal base 14 (FIGS. 7A and 7B). In addition, herein, although the method of disposing the line-shaped resin sheet 20a in plural times is described as an example, for example, the method of disposing the frame-shaped resin sheet 20a in one time may be used.

Figure 8A:
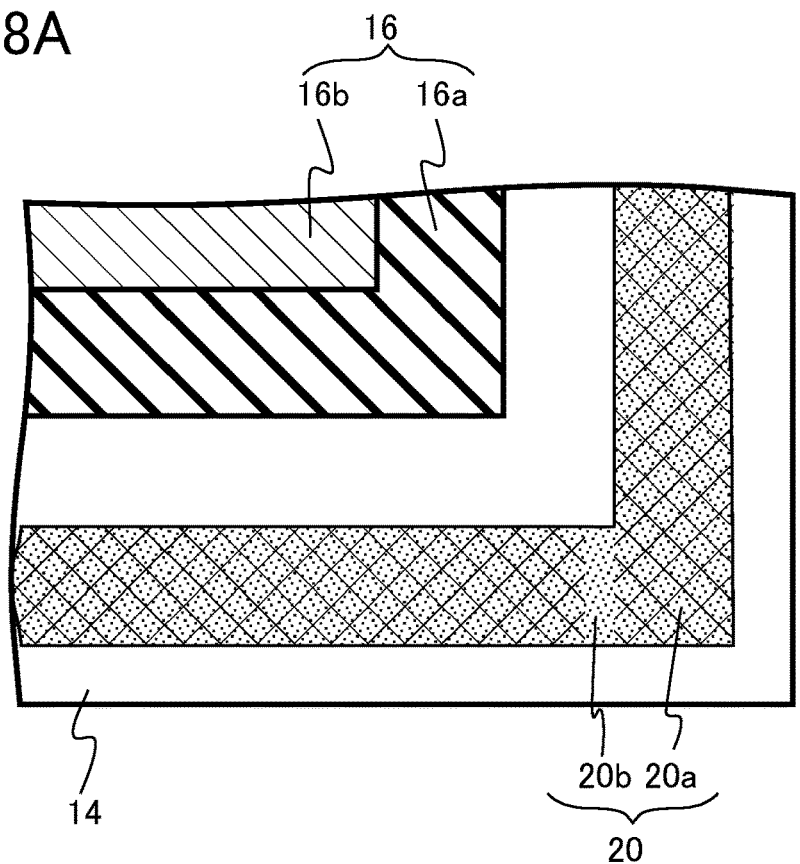
FIGS. 8A and 8B are views illustrating the method of manufacturing the semiconductor device according to the embodiment.
Figure 8B:
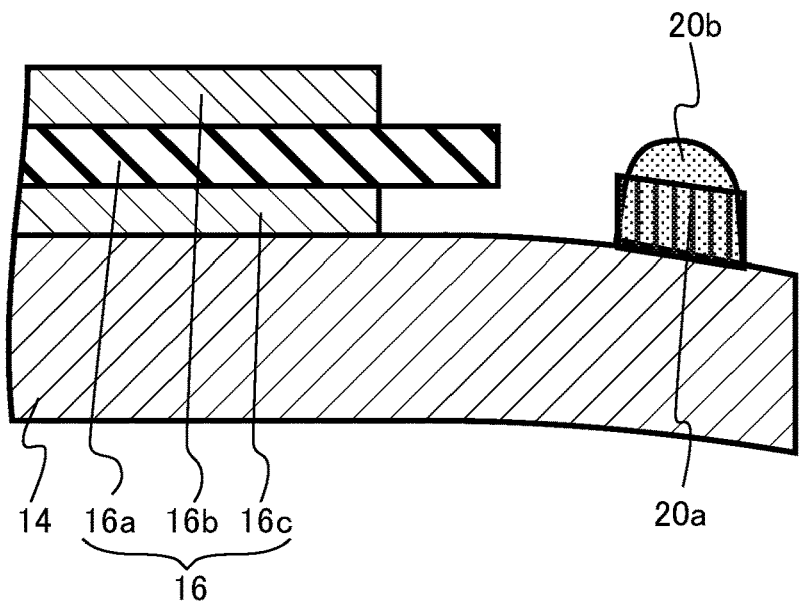

Next, the adhesive agent 20b is applied on the resin sheet 20a (FIGS. 8A and 8B). The adhesive agent 20b is, for example, a thermosetting resin having a low viscosity of 100 Pa·s or less. The adhesive agent 20b applied on the resin sheet 20a is retained on the resin sheet 20a by surface tension.

Figure 9A:
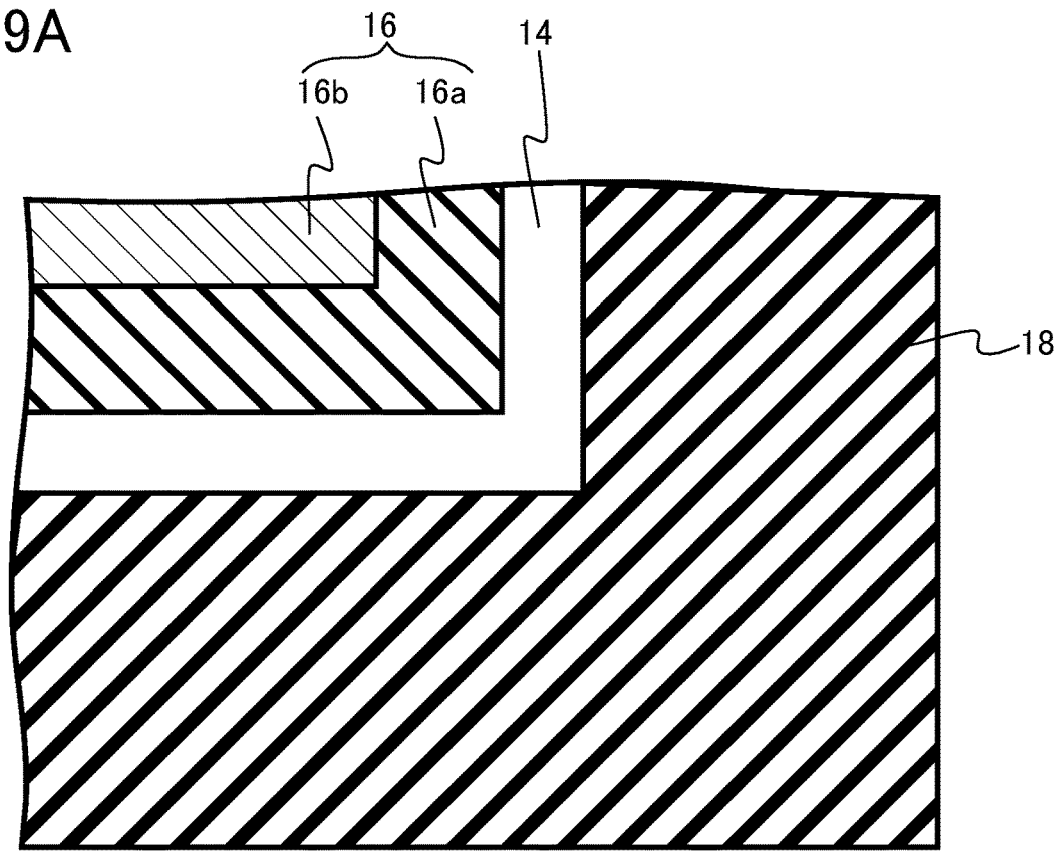
FIGS. 9A and 9B are views illustrating the method of manufacturing the semiconductor device according to the embodiment.
Figure 9B:
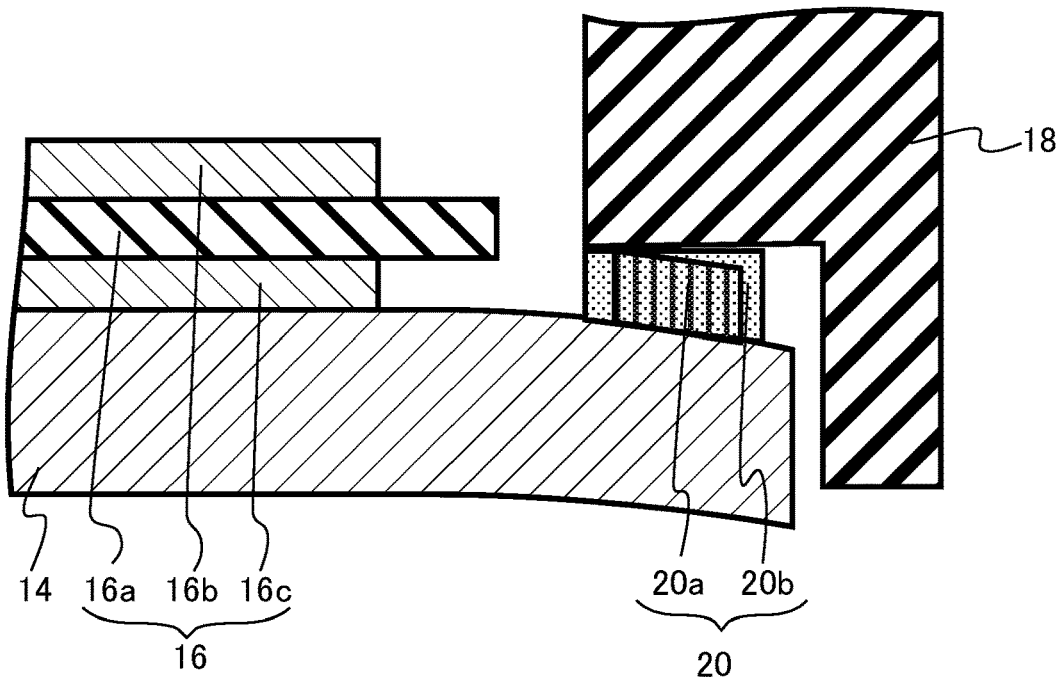

Next, the resin case 18 is placed on the metal base (FIGS. 9A and 9B). After that, heat treatment is performed to cure the adhesive agent 20b, so that the metal base 14 and the resin case 18 are fixed. An adhesive layer 20 including a resin sheet 20a and an adhesive agent 20b is formed between the metal base 14 and the resin case 18.

Next, by the bonding wire 26, the first power terminal 22 and the first IGBT 10 are connected, the surface metal layer 16b and the second IGBT 12 are connected, and the surface metal layer 16b and the second power terminal 24 are connected.

Figure 10A:
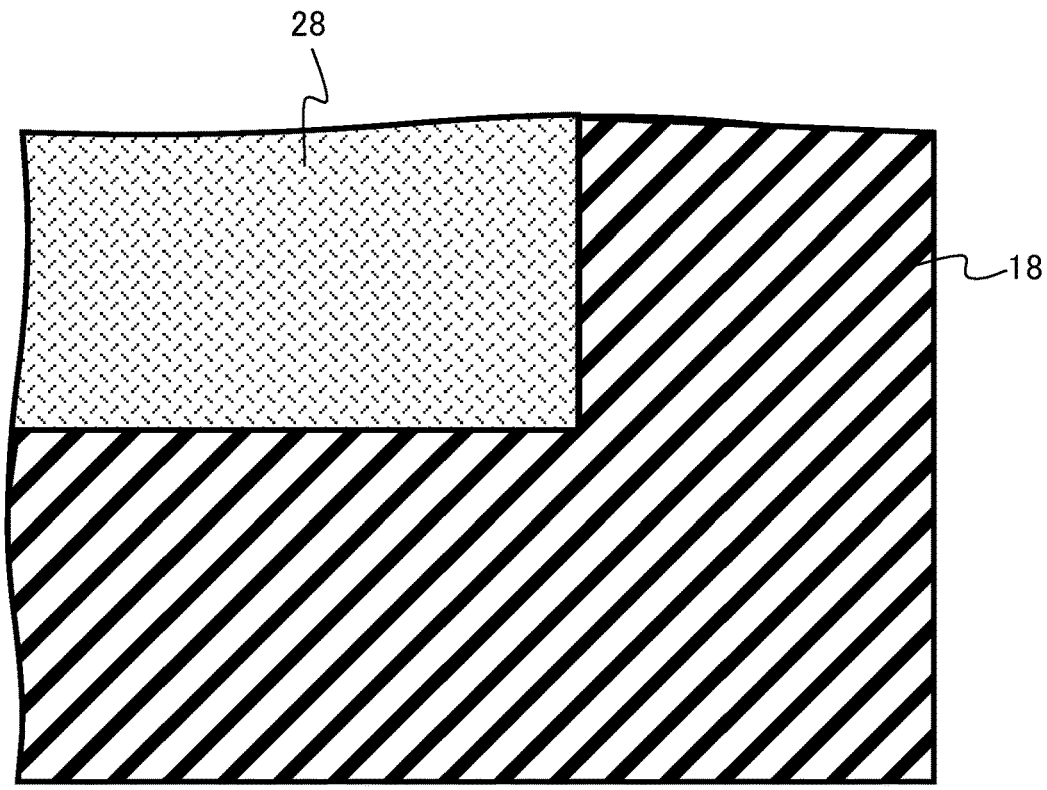
FIGS. 10A and 10B are views illustrating the method of manufacturing the semiconductor device according to the embodiment.
Figure 10B:
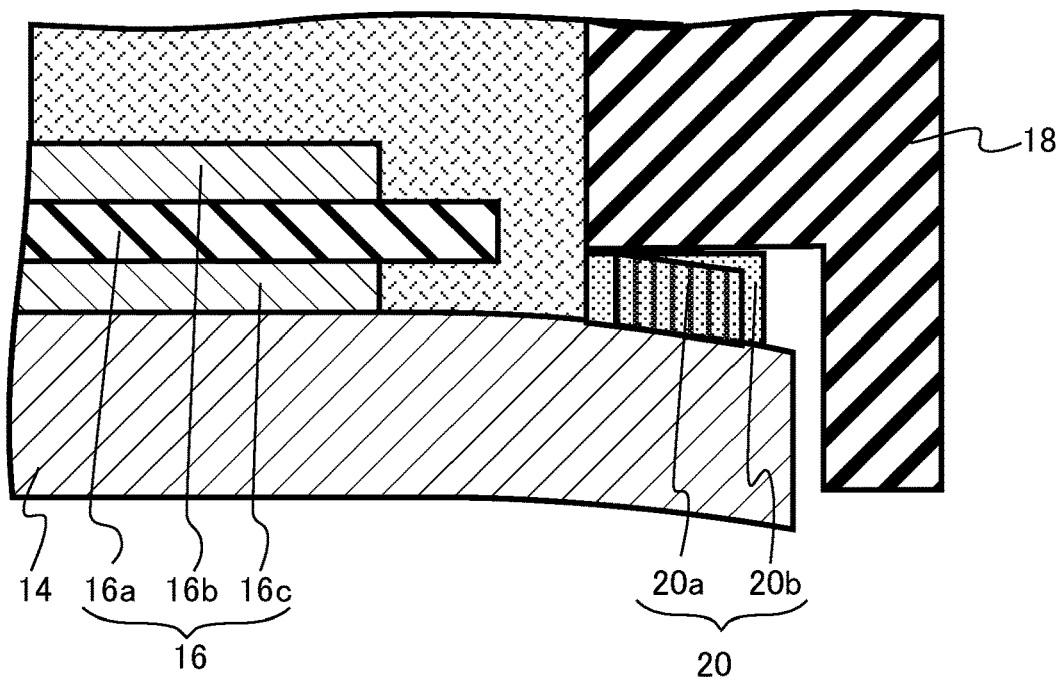

Next, the region surrounded by the resin case 18 is filled with the sealing resin 28 (FIGS. 10A and 10B). After that, the sealing resin 28 is cured by heat treatment. The sealing resin 28 is made of, for example, silicone gel.

By the above manufacturing method, the power semiconductor module 100 according to the embodiment illustrated in FIGS. 1A, 1B, 1C, 2A, 2B, 3A, and 3B is manufactured.

Next, the function and effect of the semiconductor device according to the embodiment will be described.

FIGS. 11A, 11B, 12A, 12B, 13A, 13B, 14A, and 14B are views illustrating the method of manufacturing the semiconductor device according to Comparative Example. FIGS. 11A, 12A, 13A, and 14A are views of portions corresponding to FIG. 3A of the embodiment. FIGS. 11B, 12B, 13B, and 14B are views of portions corresponding to FIG. 3B of the embodiment.

The semiconductor device according to Comparative Example is a power semiconductor module. The power semiconductor module of Comparative Example is different from the power semiconductor module 100 according to the embodiment in that the adhesive layer 20 does not include the resin sheet 20a. Hereinafter, a portion of contents overlapping with the method of manufacturing the power semiconductor module 100 according to the embodiment will be omitted in description.

Figure 11A:
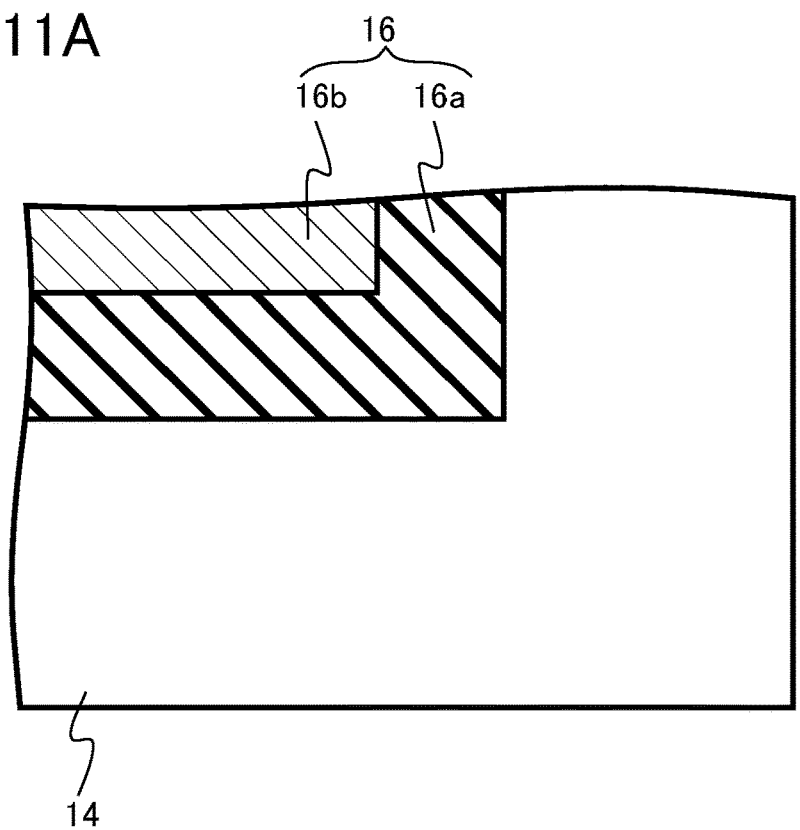
FIGS. 11A and 11B are views illustrating a method of manufacturing a semiconductor device according to Comparative Example.
Figure 11B:
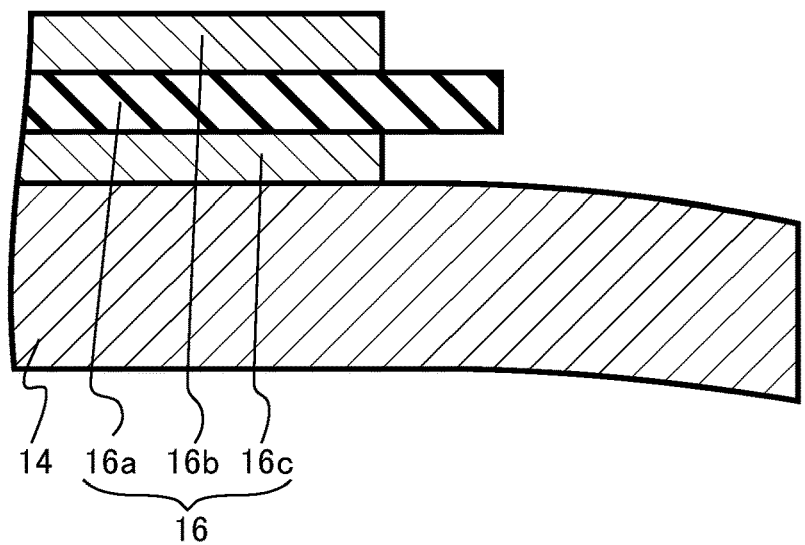

First, the insulating substrate 16 on which the first IGBT 10 and the second IGBT 12 are mounted is fixed on the metal base 14 (FIGS. 11A and 11B).

Figure 12A:
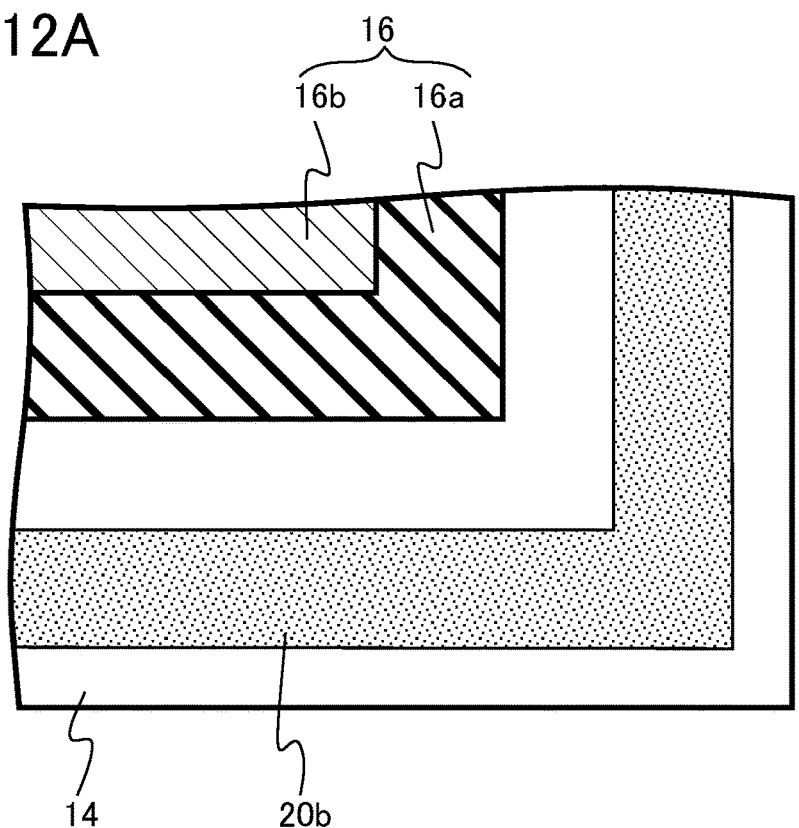
FIGS. 12A and 12B are views illustrating the method of manufacturing the semiconductor device according to Comparative Example.
Figure 12B:
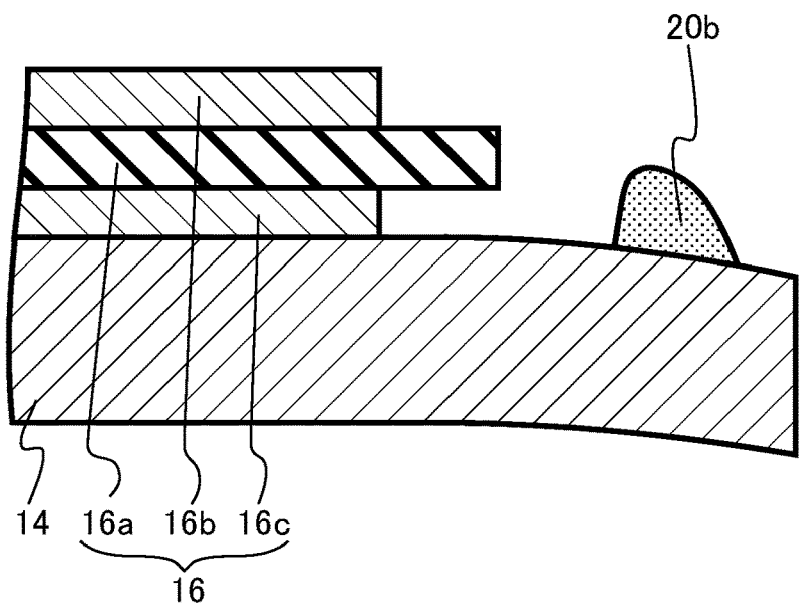

Next, the adhesive agent 20b is applied on the metal base 14 (FIGS. 12A and 12B). The adhesive agent 20b is applied on the region of the resin case 18 where the adhesion is planned.

Figure 13A:
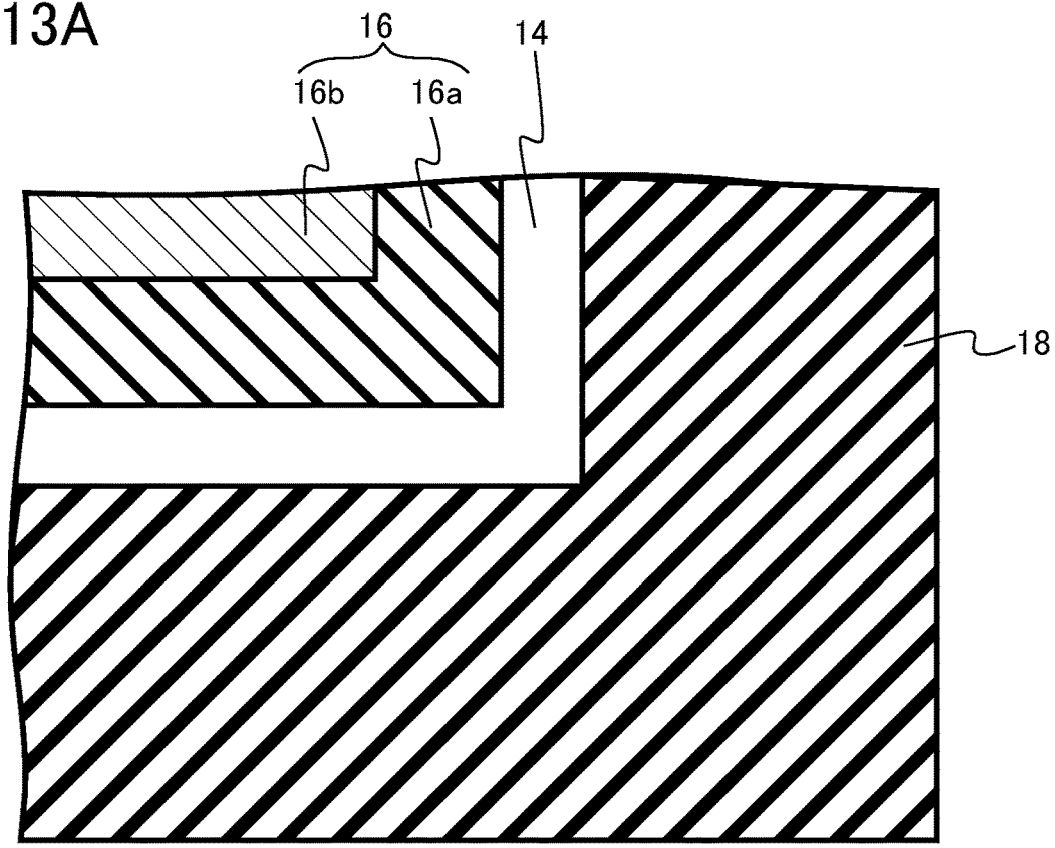
FIGS. 13A and 13B are views illustrating the method of manufacturing the semiconductor device according to Comparative Example.
Figure 13B:
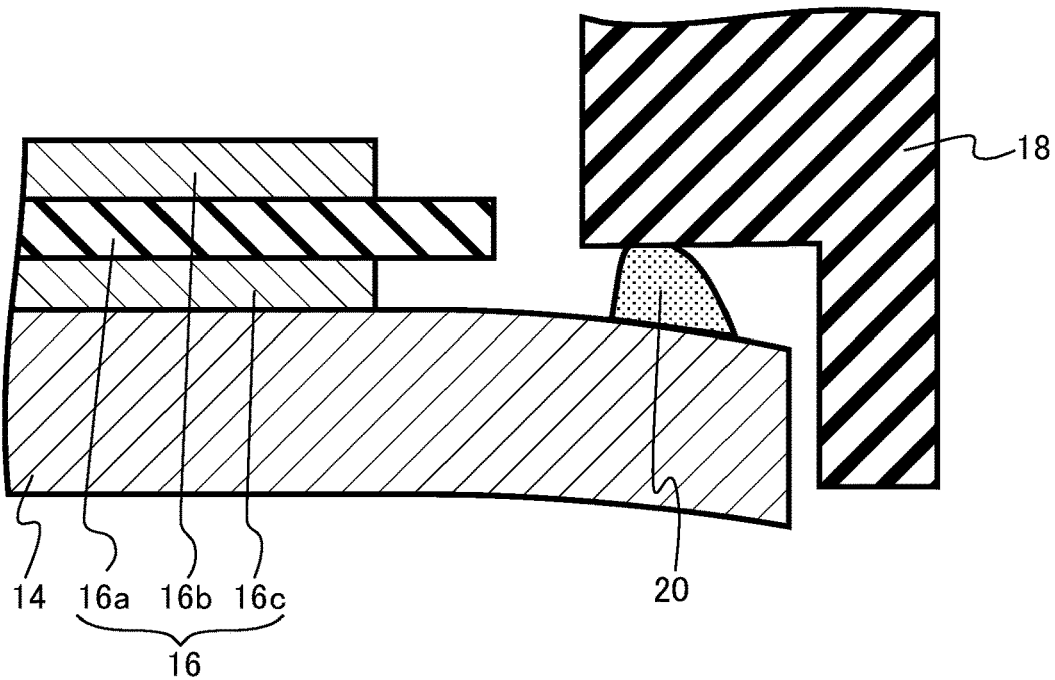

Next, the resin case 18 is placed on the metal base (FIGS. 13A and 13B). After that, heat treatment is performed to cure the adhesive agent 20b, so that the metal base 14 and the resin case 18 are fixed. An adhesive layer 20 is formed between the metal base 14 and the resin case 18.

Next, by the bonding wire 26, the first power terminal 22 and the first IGBT 10 are connected, the surface metal layer 16b and the second IGBT 12 are connected, and the surface metal layer 16b and the second power terminal 24 are connected.

Figure 14A:
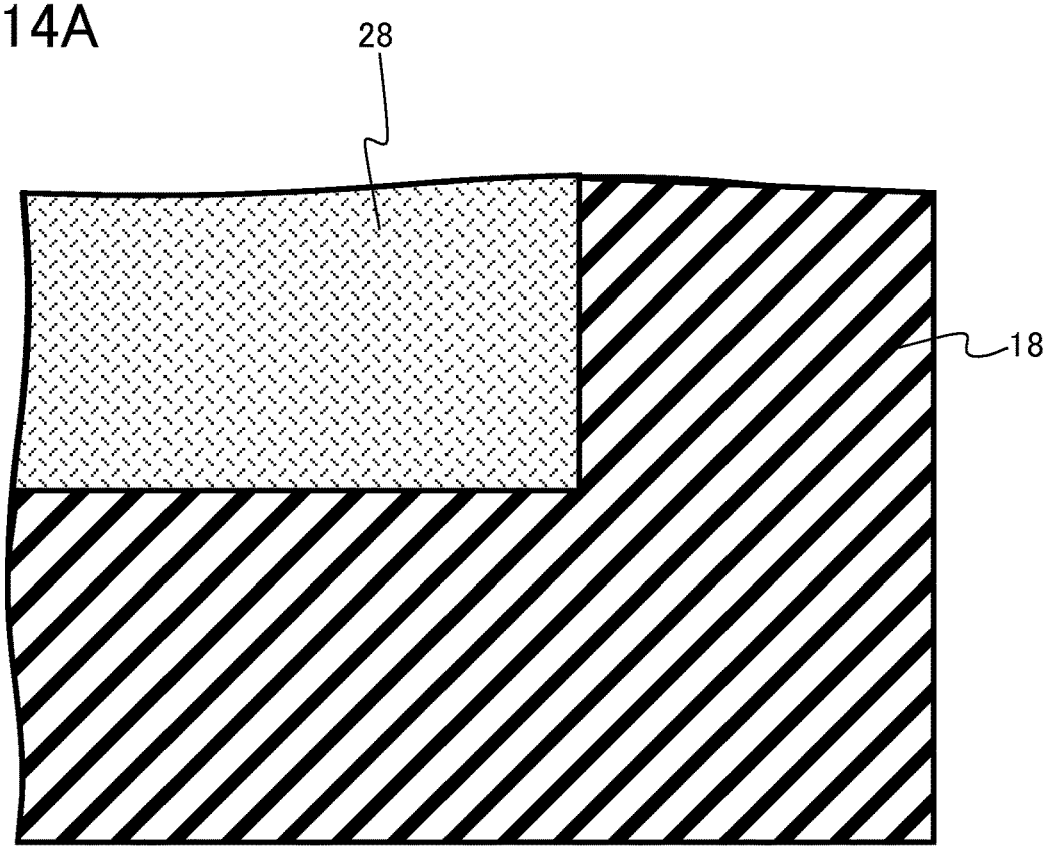
FIGS. 14A and 14B are views illustrating the method of manufacturing the semiconductor device according to Comparative Example.
Figure 14B:
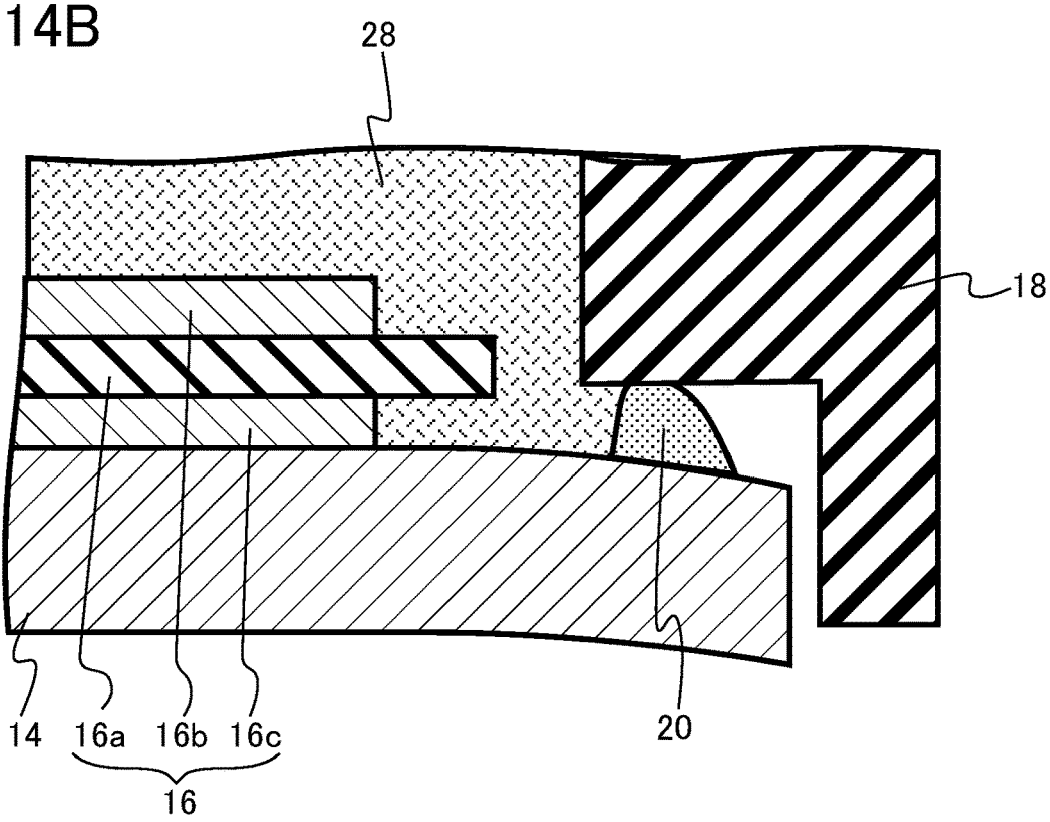

Next, the region surrounded by the resin case 18 is filled with the sealing resin 28 (FIGS. 14A and 14B). After that, the sealing resin 28 is cured by heat treatment.

Figure 15A:
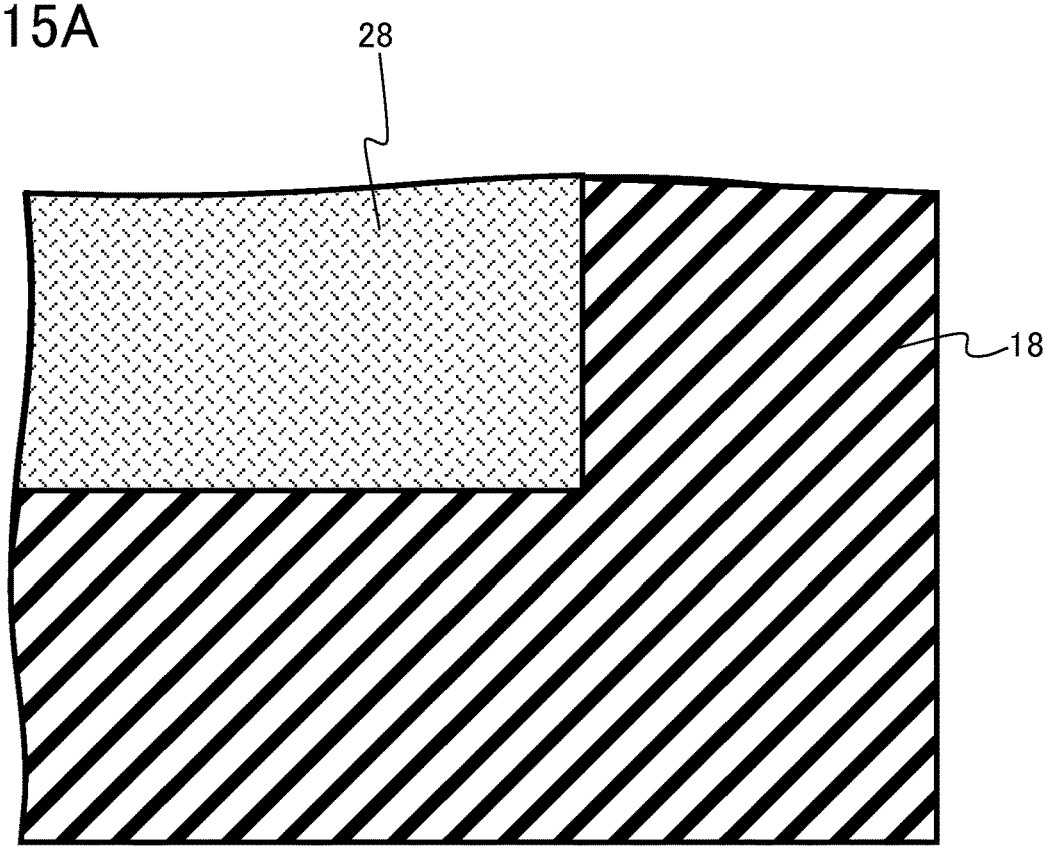
FIGS. 15A and 15B are explanatory views of problems that may occur in the semiconductor device according to Comparative Example.
Figure 15B:
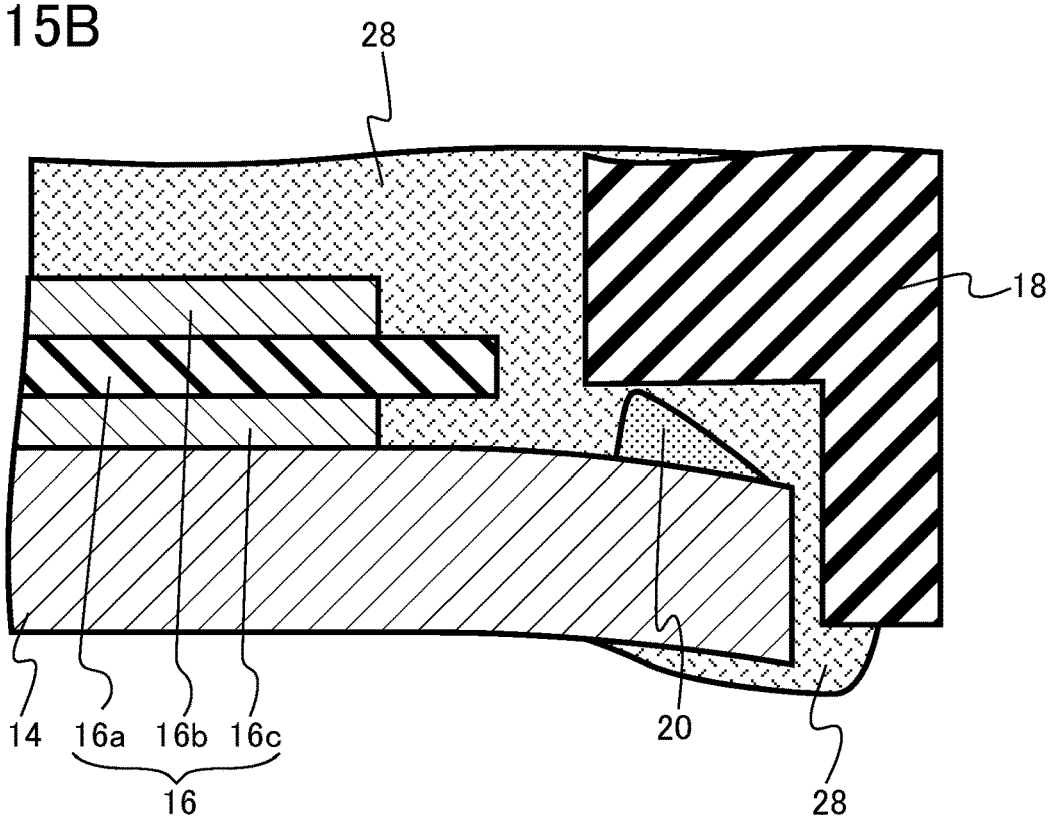

FIGS. 15A and 15B are explanatory views of problems that may occur in the semiconductor device according to Comparative Example. FIGS. 15A and 15B are views corresponding to FIGS. 14A and 14B.

In the case of the power semiconductor module of Comparative Example, for example, after the adhesive agent 20b is applied on the metal base 14, when the elapsed time becomes long, the adhesive agent 20b spreads to be deformed in the lateral direction. When the adhesive agent 20b is deformed, the height of the adhesive agent 20b becomes low. When the height of the adhesive agent 20b becomes low, the adhesion area between the metal base 14 and the resin case 18 becomes small, and thus, there is a concern that the adhesion becomes insufficient.

In particular, when the surface of the metal base 14 is inclined, since a portion where the distance between the metal base 14 and the resin case 18 becomes large occurs at the end of the metal base 14, there is a concern that the adhesion becomes insufficient.

When the height of the adhesive agent 20b becomes low and a place where the adhesion between the metal base 14 and the resin case 18 is insufficient exists, for example, as illustrated in FIG. 15B, there is a concern that the sealing resin 28 leaks out from between the metal base 14 and the resin case 18. When the sealing resin 28 penetrates around the back surface of the metal base 14, for example, when a semiconductor module is mounted on a product, there occurs a problem in heat conduction with a heat dissipation plate.

In addition, when a portion where the adhesion between the metal base 14 and the resin case 18 is insufficient exists, for example, moisture enters the inside of the semiconductor module during the use of the semiconductor module, so that the reliability of the power semiconductor module is decreased.

Generally, the low-viscosity adhesive agent 20b has high adhesiveness. Therefore, from the viewpoint of improving the reliability of the power semiconductor module, it is preferable to employ the low-viscosity adhesive agent 20b. However, when the low-viscosity adhesive agent 20b is used, the amount of deformation of the adhesive agent 20b with the passage of time is increased. For this reason, strict time management from the application of the adhesive agent 20b to the placement of the resin case 18 is required, and thus, there is a concern that the productivity will be decreased.

Figure 16A:
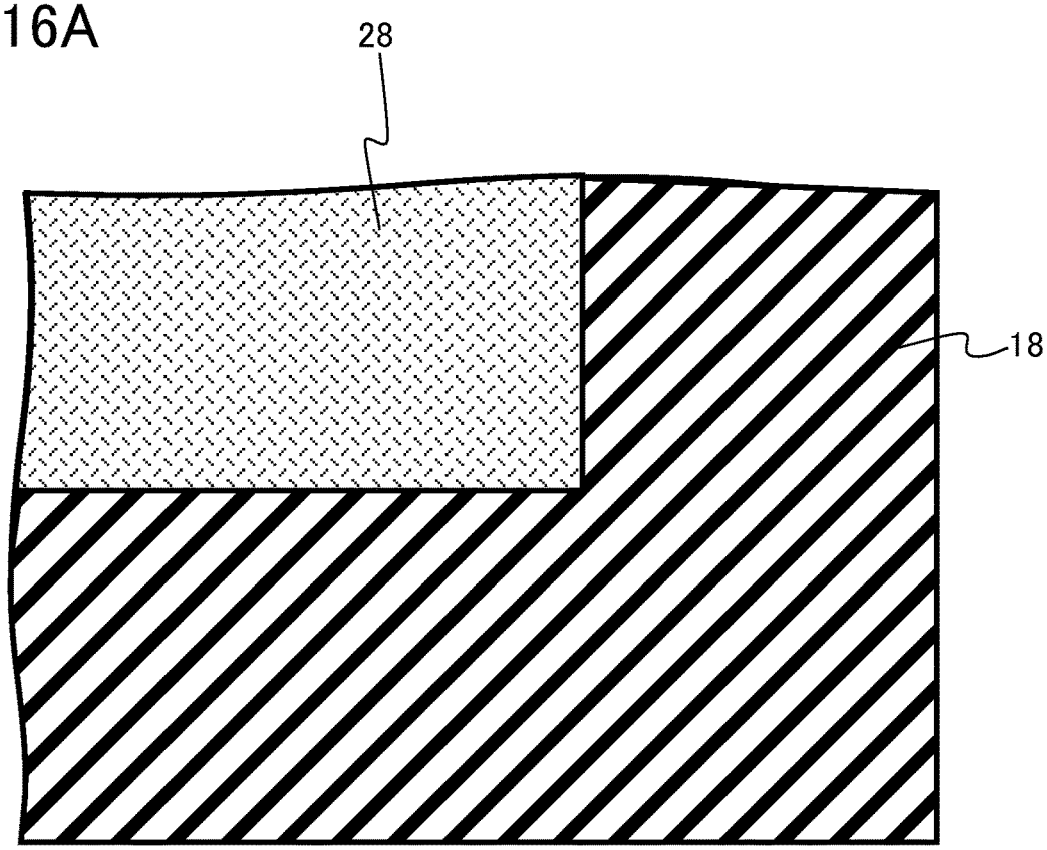
FIGS. 16A and 16B are explanatory views of problems that may occur in the semiconductor device according to Comparative Example.
Figure 16B:
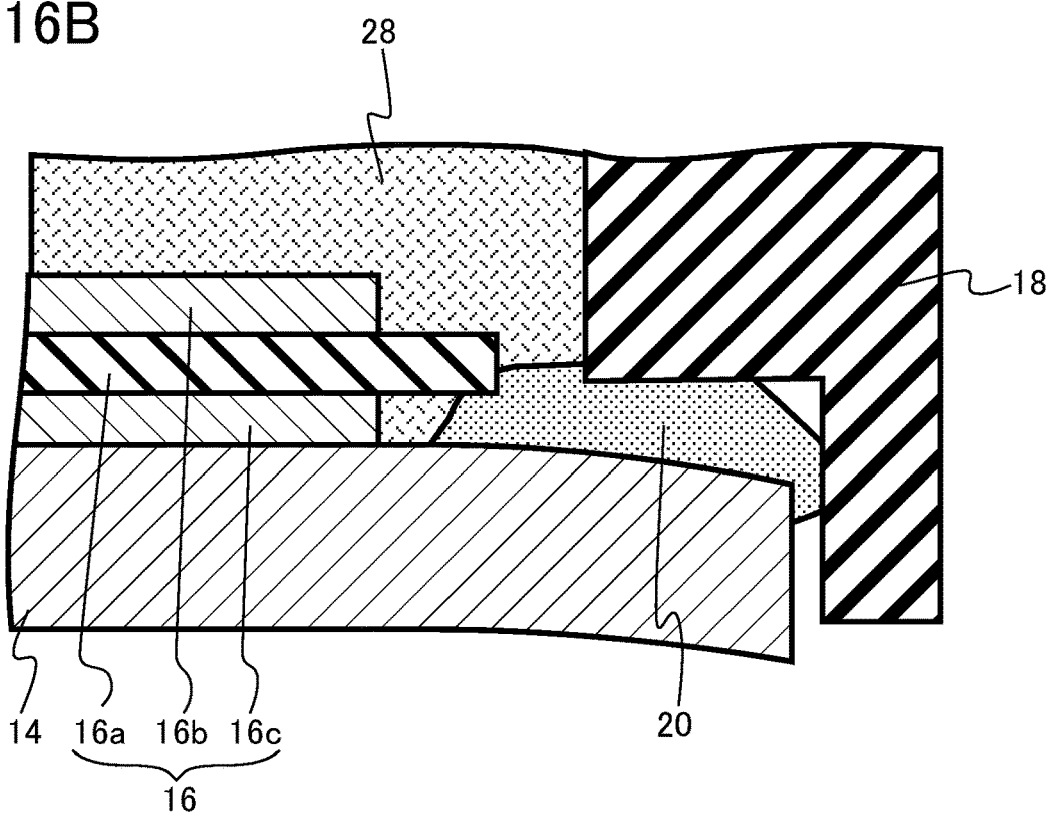

FIGS. 16A and 16B are explanatory views of problems that may occur in the semiconductor device according to Comparative Example. FIGS. 16A and 16B are views corresponding to FIGS. 14A and 14B.

In the power semiconductor module according to Comparative Example, in order to improve the adhesiveness between the metal base 14 and the resin case 18, the amount of the adhesive agent 20b to be applied is considered to be increased. By increasing the amount of the adhesive agent 20b to be applied, the height of the adhesive agent 20b before placing the resin case 18 can be sufficiently maintained. In addition, the adhesion area between the metal base 14 and the resin case 18 after the adhesion becomes large, and thus, there is a high possibility that sufficient adhesiveness can be obtained.

However, when the amount of the adhesive agent 20b to be applied is increased, as illustrated in FIG. 16B, there is a concern that the excess adhesive agent 20b penetrates around under the ceramic layer 16a of the insulating substrate 16. In this case, the adhesive agent 20b under the ceramic layer 16a thermally expands, and thus, the ceramic layer 16a is broken, so that there is a concern that poor reliability occurs. When the ceramic layer 16a is broken, there is a concern that, for example, a leak current flows between the first IGBT 10 and the metal base 14.

Also, increasing the amount of adhesive agent 20b to be applied is not preferable because the increasing the amount of adhesive agent 20b to be applied leads to an increase in the manufacturing cost of the power semiconductor module.

In the power semiconductor module 100 according to the embodiment, the adhesive layer 20 includes the resin sheet 20a. When manufacturing the power semiconductor module 100, the adhesive agent 20b is applied on the resin sheet 20a.

The adhesive agent 20b applied on the resin sheet 20a is retained on the resin sheet 20a by the surface tension. For this reason, after the adhesive agent 20b is applied on the metal base 14, even when the elapsed time becomes long, the adhesive agent 20b is suppressed from spreading to be deformed in the lateral direction. Therefore, the height of the adhesive agent 20b can be sufficiently maintained. Accordingly, the adhesive area between the metal base 14 and the resin case 18 can be sufficiently secured, and thus, the adhesiveness between the metal base 14 and the resin case 18 is improved.

Since the adhesive agent 20b is retained on the resin sheet 20a by the surface tension, sufficient adhesiveness can be secured by a small amount of the adhesive agent 20b. Therefore, the excess adhesive agent 20b is prevented from penetrating around under the ceramic layer 16a. Accordingly, the reliability of the power semiconductor module 100 is improved.

Also, since sufficient adhesiveness can be secured by a small amount of the adhesive agent 20b, an increase in manufacturing cost of the power semiconductor module is suppressed.

Since the adhesive agent 20b is prevented from spreading to be deformed in the lateral direction, the low-viscosity adhesive agent 20b having high adhesive strength can be used without strict time management. Since the strict time management is unnecessary, the productivity of the power semiconductor module 100 is improved.

Further, when manufacturing the power semiconductor module 100, it becomes easy to inspect the application position deviation of the adhesive agent 20b by applying the adhesive agent 20b on the resin sheet 20a. For this reason, the productivity of the power semiconductor module 100 is improved. Due to the existence of the resin sheet 20a, the region where the adhesive agent 20b is planned to be applied is clarified, and thus the visibility of the application position deviation of the adhesive agent 20b is improved.

As described above, according to the embodiment, it is possible to realize a semiconductor device in which the adhesiveness between the metal plate and the resin case is improved.

In the embodiment, the case where the IGBT is used as the semiconductor chip has been described as an example, but the semiconductor chip is not limited to these. For example, other transistors or diodes such as MOSFET, Schottky barrier diode (SBD), and PIN diode can be employed. In addition, a combination of transistors and diodes can be employed.

In the embodiment, the case where the number of semiconductor chips is two has been described as an example, but the number of semiconductor chips may be one or three or more.

While certain embodiments have been described, these embodiments have been presented by way of example only, and are not intended to limit the scope of the inventions. Indeed, semiconductor devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a metal plate;
a semiconductor chip;
an insulating substrate provided between the metal plate and the semiconductor chip;
a frame body surrounding the insulating substrate;
a mesh-shaped sheet provided between the metal plate and the frame body;
an adhesive agent provided between the metal plate and the frame body, wherein the frame body surrounds the metal plate, and the mesh-shaped sheet and the adhesive agent are located between the frame body and the metal plate in a direction from the metal plate toward the insulating substrate; and
a sealing material being surrounded by the frame body and covering the semiconductor chip and the insulating substrate.

2. The semiconductor device according to claim 1, wherein an upper surface and a side surface of the mesh-shaped sheet are in direct contact with the adhesive agent.

3. The semiconductor device according to claim 1, wherein the mesh-shaped sheet is apart from the semiconductor chip in a direction parallel to a surface of the metal plate.

4. The semiconductor device according to claim 1, wherein mesh openings of the mesh-shaped sheet is 50 μm or more and 1000 μm or less.

5. The semiconductor device according to claim 1, wherein at least a portion of the adhesive agent is located in a mesh of the mesh-shaped sheet.

6. The semiconductor device according to claim 1, wherein a thickness of the mesh-shaped sheet is 200 μm or more and 500 μm or less.

7. The semiconductor device according to claim 1, wherein a lower surface of the metal plate has a shape convex upwards.

8. The semiconductor device according to claim 1, wherein the sealing material is made of silicone gel.

9. The semiconductor device according to claim 1, wherein the frame body contains a resin.

10. The semiconductor device according to claim 1, wherein the mesh-shaped sheet contains a resin.

11. The semiconductor device according to claim 10, wherein the mesh-shaped sheet contains silicone.

12. The semiconductor device according to claim 1, wherein the adhesive agent contains a resin.

13. The semiconductor device according to claim 12, wherein the adhesive agent contains silicone.

14. A semiconductor device comprising:
a metal plate;
a semiconductor chip;
an insulating substrate provided between the metal plate and the semiconductor chip;
a frame body surrounding the insulating substrate;
an adhesive layer between the metal plate and the frame body, the adhesive layer containing a mesh-shaped sheet and an adhesive agent, the adhesive agent located in mesh openings of the mesh-shaped sheet, wherein the mesh openings of the mesh-shaped sheet are smaller than a width of the adhesive layer in a direction that is parallel to a surface of the metal plate and perpendicular to an extending direction of the adhesive layer; and
a sealing material being surrounded by the frame body and covering the semiconductor chip and the insulating substrate.

15. The semiconductor device according to claim 14, wherein an upper surface and a side surface of the mesh-shaped sheet are in direct contact with the adhesive agent.

16. The semiconductor device according to claim 14, wherein the mesh-shaped sheet is apart from the semiconductor chip in a direction parallel to a surface of the metal plate.

17. The semiconductor device according to claim 14, wherein the mesh openings of the mesh-shaped sheet is 50 μm or more and 1000 μm or less.

18. The semiconductor device according to claim 14, wherein a thickness of the mesh-shaped sheet is 200 μm or more and 500 μm or less.

19. The semiconductor device according to claim 14, wherein a lower surface of the metal plate has a shape convex upwards.

20. The semiconductor device according to claim 14, wherein the sealing material is made of silicone gel.

21. The semiconductor device according to claim 14, wherein the frame body contains a resin.

22. The semiconductor device according to claim 14, wherein the mesh-shaped sheet contains a resin.

23. The semiconductor device according to claim 22, wherein the mesh-shaped sheet contains silicone.

24. The semiconductor device according to claim 14, wherein the adhesive agent contains a resin.

25. The semiconductor device according to claim 24, wherein the adhesive agent contains silicone.

* * * * *